United States Patent [19]
Adachi

[11] Patent Number: 5,475,877
[45] Date of Patent: Dec. 12, 1995

[54] MOBILE WIRELESS SET WITH IMPROVED INTERMITTENT OPERATION CONTROL AND REDUCED POWER CONSUMPTION

[75] Inventor: Keigo Adachi, Hyogo, Japan

[73] Assignee: Mitsubishi Denki Kabushiki Kaisha, Tokyo, Japan

[21] Appl. No.: 203,581

[22] Filed: Mar. 1, 1994

[30] Foreign Application Priority Data

Mar. 26, 1993 [JP] Japan .................................. 5-090434

[51] Int. Cl.$^6$ ................................................. H04B 1/16
[52] U.S. Cl. ........................... 455/343; 455/33.3; 455/76; 331/14
[58] Field of Search ..................... 455/343, 38.3, 455/69, 70, 75, 76, 165.1, 183.1, 260; 370/95.3; 331/14

[56] References Cited

U.S. PATENT DOCUMENTS 4,673,892  6/1987  Miyashita et al. ..................... 331/14
4,777,655  10/1988  Numata et al. ....................... 455/343
4,893,094  1/1990  Herold et al. ........................ 331/14

FOREIGN PATENT DOCUMENTS 60-190032  9/1985  Japan .
2261226  10/1990  Japan .

*Primary Examiner*—Edward F. Urban
*Assistant Examiner*—Doris To
*Attorney, Agent, or Firm*—Rothwell, Figg, Ernst & Kurz

[57] ABSTRACT

A mobile wireless set for supplying a power to at least a part of a frequency synthesizer only during a period necessary and sufficient to stabilize the output of the frequency synthesizer so as to draw the frequency, and, in the other period, the output of the frequency synthesizer is hold without supplying the power.

7 Claims, 9 Drawing Sheets

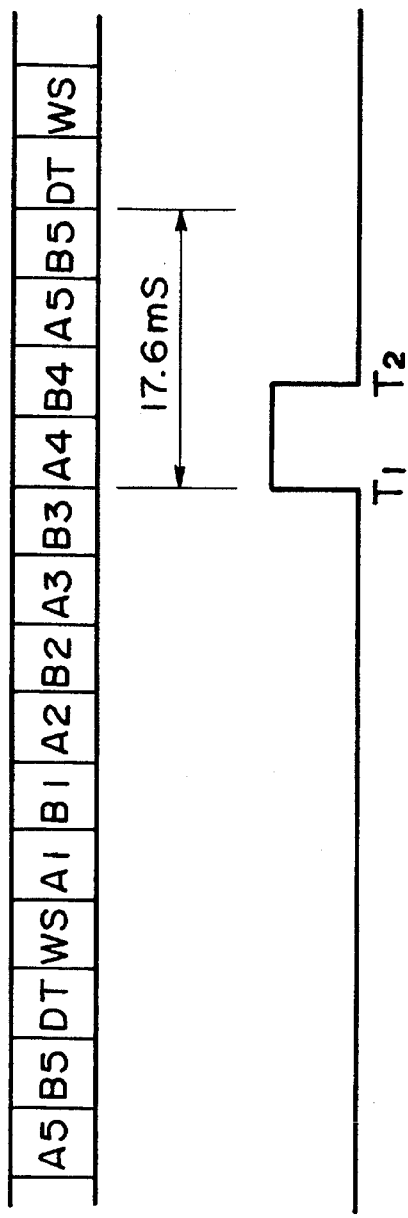
FIG.10A
FIG.10B
FIG.10C

MOBILE WIRELESS SET WITH IMPROVED INTERMITTENT OPERATION CONTROL AND REDUCED POWER CONSUMPTION

BACKGROUND OF THE INVENTION

1. Field of the Invention

The present invention relates to a mobile wireless set such as an automobile telephone set, a portable telephone set, or a portable telephone set mounted in an automobile, used in an automobile telephone system and so forth.

2. Description of the Prior Art

FIG. 1 is a block diagram showing a conventional mobile wireless set. In the figure, reference numeral 1 represents a receiving unit for demodulating a receiving signal into a sound signal or a control signal and for outputting it. Reference numeral 2 is a frequency synthesizer including a phase locked loop (herein after referred to as PLL) for supplying a signal having a frequency generated by the PLL to the receiving unit 1. Reference numeral 3 is a control unit for executing a control process in response to the control signal outputted from the receiving unit 1 so as to inform the synthesizer 2 of the frequency to be generated by providing a dividing ratio.

FIG. 2 is a block diagram showing the construction of the frequency synthesizer 2. In the figure, a reference numeral 11 is a phase detector for comparing the outputs of a programmable divider 16 and a reference divider 17. Reference numeral 12 is a charge pump for outputting a signal having an amplitude proportional to the phase difference between the outputs detected by the phase detector 11. Reference numeral 13 is a loop filter for removing the high frequency components from the output of the charge pump 12, and 14 is a voltage-controlled oscillator. Reference numeral 15 is a prescaler for dividing the output frequency of the voltage-controlled oscillator 14, and 16 is a programmable divider for further dividing the output of the prescaler 15 by the specified dividing ratio given by the control unit 3. Reference numeral 17 is the afore-mentioned reference divider for generating a signal having the reference frequency by dividing a reference signal to send the signal having the reference frequency to the phase detector 11.

Next, the operation of the frequency synthesizer 2 will be described. The reference divider 17 divides the reference signal, which is outputted from, for example, a crystal oscillator 18, by the dividing ratio given by the control unit 3, to generate the signal having the reference frequency. The signal having the reference frequency is inputted into the phase detector 11. On the other hand, the programmable divider 16 divides the output signal of the proscaler 15 by the dividing ratio specified by the control unit 3, and outputs the divided signal to the phase detector 11. The signal outputted from the reference divider 17 and the signal outputted from the programmable divider 16 are compared in phase by the phase detector 11. The charge pump 12 outputs the signal proportional to the phase difference between the signals detected by the phase detector 11. The output signal of the charge pump 12 is inputted into the loop filter 13 in which the high frequency components are removed from the signal inputted into the charge pump 12. Then the signal without the high frequency components is inputted into the voltage-controlled oscillator 14. The voltage-controlled oscillator 14 oscillates with a frequency proportional to the output voltage of the loop filter 13. The output signal of the voltage-controlled oscillator 14 is sent as a local oscillating signal to the receiving unit 1 (FIG. 1), and also is inputted into the prescaler 15. The prescaler 15 divides the frequency of the output signal from the voltage-controlled oscillator 14 and outputs the divided signal to the programmable divider 16. Thus, by synchronizing the output signal of the reference divider 17 and the output signal of the programmable divider 16 to have a predetermined phase difference therebetween, the output signal of the voltage-controlled oscillator 14 is stabilized with a predetermined frequency determined by the dividing ratio specified by the control unit 3.

In the mobile wireless set employing the frequency synthesizer 2 as described above, when the mobile wireless set is in a waiting state for waiting an arriving call to the mobile wireless set under consideration, the frequency synthesizer 2 operates even when unnecessary data is transmitted, so that the power consumption is increased. To avoid this, an attempt has been made to decrease the power consumption by intermittently operating the frequency synthesizer during the waiting state.

FIG. 3 is a block diagram showing an example of a conventional frequency synthesizer which is operated intermittently and which is included in a mobile wireless set disclosed in, for example, Japanese Patent Publication (Kokai) No. 60-190032. In the figure, reference numeral 20 is a PLL circuit including a prescaler, a programmable divider, a reference divider, a phase detector, and so forth. The PLL circuit 20, the loop filter 13, and the voltage-controlled oscillator 14 constitute a frequency synthesizer. Reference numeral 21 is a switch provided between the PLL circuit 20 and the loop filter 13, for cutting the loop in the circuit of the frequency synthesizer. Reference numeral 22 is a charge and discharge circuit for intermittently charge or discharge capacitors in the loop filter 13 when the loop is cut. Reference numeral 23 is a switch for controlling the connection between the charge and discharge circuit 22 and the loop filter 13. Reference numeral 24 is an inverter for complementary opening and closing the switch 21 and the switch 23, based on a loop cutting signal intermittently generated by a control unit.

Next, the operation of the circuit shown in FIG. 3 will be described. In a normal operating state in which the loop cutting signal is not given by the control unit 3, the switch 21 is closed and the switch 23 is opened. Accordingly, the frequency synthesizer operates in the similar way as in the case described with reference to FIG. 2 so that the voltage-controlled oscillator 14 stably oscillates to output a signal having the specified predetermined frequency. On the other hand, when the loop cutting signal is inputted, the switch 2S is turned ON so that the charge and discharge circuit 22 is connected to the loop filter 13. In addition, the loop cutting signal is sent through the inverter 24 to the switch 21 to turn it to the OFF state. Simultaneous with this, the power supply to the PLL circuit 20 is cut. By this operation, the consuming power in the frequency synthesizer is decreased to almost only the power consumed in the voltage-controlled oscillator 14.

Since the mobile wireless set shown in FIG. 3 is constructed as above, to keep the frequency of the output signal of the frequency synthesizer during a period when the power supply for the PLL circuit 20 is cut, it is necessary to provide the charge and discharge circuit 22 for charging and discharging charges in the capacitors of the loop filter 13. Because of the presence of the charge and discharge circuit 22, the mobile wireless set becomes complicated and expensive.

In addition, there is another problem in that the control of the time constant of the charge and discharge in the charge and discharge circuit 22 is complex as described below. Namely, it is assumed that the charge and discharge circuit 22 does not operate during the period when the loop cutting signal is ON. In this condition, in case there is no leakage current in the switches 21 and 23, the charges stored in the capacitors in the loop filter 13 are discharged depending on the lapse of time so that the frequency of the output signal of the voltage-controlled oscillator 14 is gradually lowered. The fluctuation of the frequency depends on the control voltage which is the output voltage of the loop filter 13 and inputted to the voltage-controlled oscillator 14. Namely, when the control voltage is low, the amount of discharge of the charges stored in the capacitors in the loop filter 13 is small so that the fluctuation of the frequency is small; and when the control voltage is high, the amount of discharge of the charges stored in the capacitors in the loop filter 13 is large so that the fluctuation of the frequency is large. On the other hand, in case there is a leakage current in the switches 21 or 23, and if the leakage current is larger than the discharge current from the loop filter 13, the capacitors in the loop filter 13 are gradually charged so that the frequency is conversely increased. In this case, the higher the control voltage, the smaller the change in the frequency.

The fluctuation of the frequency of the output signal of the frequency synthesizer of this type is compensated by charging or discharging the capacitors in the loop filter 13 by the charge and discharge circuit 22 connected to the loop filter 13 by closing the switch 23. As mentioned above, however, in both cases where there is a leakage current and where there is no leakage current in the switches 21 and 23, the fluctuation of the frequency largely depends on the control voltage (or a holding voltage) inputted to the voltage-controlled oscillator 14. Accordingly, to charge or discharge the capacitors in the loop filter 13 by means of the charge and discharge circuit 22, it is necessary to finely control the amount of charges to be charged or discharged, corresponding to the control voltage inputted to the voltage-controlled oscillator 14, so that the control becomes complex.

FIG. 4 is a block diagram showing another example of a conventional frequency synthesizer which is operated intermittently and which is included in a mobile wireless set disclosed in, for example, Japanese Patent Publication (Kokai) No. 2-261226. In the figure, reference numeral 4 is a control unit which is different from the control unit 3 shown in FIG. 1 in that the control unit 4 generates an intermittent signal based on the control signal demodulated by the receiving unit 1, during a waiting state to wait an arriving call to the mobile wireless set under consideration. Reference numeral 5 is a power supply unit for supplying a necessary power to the control unit 4, the receiving unit 1, and the frequency synthesizer 2. Reference numeral 6 is a power switch for turning ON or OFF of the power to be supplied from the power supply unit 5 to the receiving unit 1 or to the frequency synthesizer 2.

Next, the operation of the circuit shown in FIG. 4 will be described. When an input electric field detecting circuit in the receiving unit 1 detects an input electric field having a level higher than a predetermined level, the mobile wireless set under consideration enters into a waiting state for waiting an arriving call to the mobile wireless set so that the control unit 4 turns ON the power switch 6. Thereby, the receiving unit 1 and the frequency synthesizer 2 start to operate so that the frequency synthesizer 2 sends the signal having the frequency determined by the dividing ratio specified by the control unit 4 to the receiving unit 1, and the receiving unit 1 sends the control signal, which is demodulated from the receiving signal based on the frequency, to the control unit 4. The control unit 4 generates an intermittent signal which is turned ON when the received control signal is a word necessary for the mobile wireless set under consideration, thereby, the intermittent control of the receiving unit 1 and the frequency synthesizer 2 is started. An example of this conventional intermittent control will be described with reference to FIG. 5A and FIG. 5B.

FIG. 5A is a timing diagram showing the receiving data (control signal) received by the control unit 4 during a waiting state, and FIG. 5B is a timing diagram showing the intermittent signal generated by the control unit 4, in the 800 MHz mobile wireless telephone system "EIA IS-19" in U.S.A., as an example. As can be seen from FIG. 5A, under the regulation of the system "EIA IS-19", one frame of the control signal sent from the receiving unit 1 to the control unit 4 consists of a pattern of DT (Dotting) and WS (Word Sync.) indicating the head of the frame, and subsequent alternating signals A1, B1, A2, B2, A3, B3, . . . of the A words (A1 to A5) and B words (B1 to B5). The A words are control signals for a mobile wireless set having, for example, an even telephone number, and the B words are control signals for a mobile wireless set having, for example, an odd telephone number. in the A words and in the B words, calling signals for calling respective mobile wireless sets are included. Therefore, the mobile wireless set to which the A words are allocated receives the words A1 to A5 to carry out a 3/5 decision by majority for each bit in the five words. In this case, the words B1 to B5 of the B words are not necessary for the mobile wireless set under consideration.

In the prior art disclosed in the Japanese Patent Publication (Kokai) No. 2-261226, in view of the fact that the B words are not necessary for a mobile wireless set to which the A words are allocated, the power is supplied to the receiving unit 1 and the frequency synthesizer 2 only during the periods when the words A1 to A5 are received, and the power supply is stopped during the periods when the words B1 to B5 are received, thereby the reduction of the power consumption is realized. To this end, when the control unit 4 detects the dotting signal DT and the word synchronization signal WS included in the control signal shown in FIG. 5A, the control unit 4 generates an intermittent signal as shown in FIG. 5B and sends it to the power switch 6. In FIG. 5B, the intermittent signal is ON only when the A words are received. The switching operation of the power switch 6 is controlled by the intermittent signal so that the power from the power source 5 is not supplied to the receiving unit 1 and the frequency synthesizer 2 during the periods when the intermittent signal is OFF. Note that lines 51 and 52 which directly connect The power source 5 with the receiving unit 1 and the frequency synthesizer 2 are lines for directly supplying the power from the power source 5 to the parts, to which the power is always necessary to be supplied, in the receiving unit 1 and the frequency synthesizer 2.

Since the conventional mobile wireless set shown in FIG. 4 is constructed as described above, there is a problem described as follows. Namely, the power is supplied to the frequency synthesizer 2 and so forth only during the periods when the allocated words are received, so that the power supply for the frequency synthesizer 2 must be turned ON or OFF at each time one word is received in such a way that the power supply for the frequency synthesizer 2 is turned ON during the period when the word A1 is received, and the power supply for the frequency synthesizer 2 is turned OFF during the period when the word B1 is received. Because of this, during one frame period, the power supply for the frequency synthesizer 2 must be turned ON several times equal to the number of the necessary words in one frame, so that there is a problem in that the power consumption is still large.

In addition, in the frequency synthesizer 2 shown in FIG. 2, the reference divider 17 and the programmable divider 16 have a plurality of flip flops so that the phase difference between the output signals of the reference divider 17 and the programmable divider 16 is indefinite immediately after the power is turned ON again. Therefore, a large error signal is outputted from the phase detector 11 so that a long time is necessary to stabilize the frequency of the output signal of the voltage-controlled oscillator 13 after a temporal jump of the frequency. Therefore, in accordance with the intermittent signal shown in FIG. 5B in which the frequency synthesizer 2 is be turned ON several times equal to the number of the necessary words in one frame, after turning OFF the frequency synthesizer 2 in response to an end of the reception of one necessary word (for example, A1), the frequency synthesizer 2 is turned ON again in response to the reception of the next necessary word (for example, A2) before the output of the frequency synthesizer 2 is stabilized. Since this operation is repeated during one frame of the signal is received, the error in the frequency of the output signal of the frequency synthesizer 2 is increased. Therefore, actually, there is a problem in that it is difficult to turn ON or OFF of the frequency synthesizer 2 within a time period of 4.4 ms which is allocated to one word.

SUMMARY OF THE INVENTION

In view of the foregoing, it is an object of the present invention to provide a mobile wireless set in which the power consumption can be reduced by a new intermittent operation and in which the charge and discharge circuit which requires the complex control is not necessary.

It is another object of the present invention to provide a mobile wireless set in which the stability of the frequency of the output signal of the frequency synthesizer during an intermittent operation is increased.

According to the first aspect of the present invention, for achieving the above-mentioned objects, there is provided a mobile wireless set comprising intermittent signal generating means for generating, during a waiting state for waiting an arriving call, an intermittent signal which is turned ON only during one period in each frame of the control signal when the control unit receives predetermined words corresponding to the period necessary and sufficient to stabilize the output of the frequency synthesizer, and an intermittent control unit for turning ON or OFF, in response to the ON or OFF of the intermittent signal, a power supply for at least a part of a phase locked loop, and for holding, during a period when the intermittent signal is OFF, the output voltage of the phase locked loop to be the value at the ON time immediately before the OFF time.

As stated above, in the mobile wireless set in the first aspect of the present invention, since the intermittent signal generated by the intermittent signal generating means is turned ON only during the period when the predetermined words, corresponding to the period necessary and sufficient to stabilize the output of the frequency synthesizer, are inputted, and is turned OFF in the other period, the period in which the intermittent signal is OFF so that the power is not supplied to at least a part of the phase locked loop becomes long, thereby the power consumption can be reduced. In addition, since the intermittent signal is turned ON only one period necessary and sufficient within one frame, there is a long time interval between two ON periods, so that the frequency of the output signal of the frequency synthesizer is stabilized. Further, by holding the output voltage of the phase locked loop to be the value at the ON time immediately before the OFF time during the period when the intermittent signal is OFF, the stability of the frequency synthesizer in the intermittent operation can be increased.

According to the second aspect of the present invention, there is provided a mobile wireless set in which, in the mobile wireless set in the first aspect, the intermittent signal generating means comprises means for turning the intermittent signal ON during a period when the control signal receives a predetermined one word in the control signal, and for turning the intermittent signal OFF during a period when the control unit receives a signal part of the control signal other than the predetermined one word.

As stated above, in the mobile wireless set in the second aspect of the present invention, since the intermittent signal is turned ON only when the predetermined one word in the control signal is inputted, the power consumption can be greatly reduced.

According to the third aspect of the present invention, there is provided a mobile wireless set in which, in the mobile wireless set in the second aspect, the control signal includes first words allocated to the mobile wireless set and second words allocated to another mobile set, the first words and the second words being alternately multiplexed in time division, and the intermittent signal generating means comprises means for turning ON of the intermittent signal only during a period when the control unit receives a predetermined one of the second words allocated to the another mobile wireless set.

As stated above, in the mobile wireless set in the third aspect of the present invention, since the intermittent signal is turned ON only during a period when the control unit receives the predetermined one of the words allocated to the another mobile wireless set, the phase locked loop is operated only when the predetermined one word which is not necessary for the mobile wireless set under consideration is inputted, and the intermittent signal is turned OFF in the other period, thereby the power consumption can be greatly reduced. In addition, the mobile wireless set can be applied to a mobile wireless telephone system in which the words for detecting arriving calls are different depending whether the telephone number is even or odd. According to the fourth aspect of the present invention, there is provided a mobile wireless set wherein, in the mobile wireless set in the first aspect, the control signal includes first words allocated to the mobile wireless set and second words allocated to another mobile set, the first words and the second words being alternatingly multiplexed in time division, and the intermittent signal generating means comprises means for turning ON of the intermittent signal only during a period when the control unit receives a predetermined one of the first words allocated to the mobile wireless set and one of the second words subsequent to the predetermined one of the first words.

As stated above, the intermittent signal generating means in the fourth aspect of the present invention turns ON of the intermittent signal only during a period when the control unit receives a predetermined one of the first words allocated to the mobile wireless set and one of the second words subsequent to the predetermined one of the first words, thereby a mobile wireless set having a time margin in a frequency drawing time for the frequency synthesizer can be realized.

According to the fifth aspect of the present invention, there is provided a mobile wireless set, wherein, in the mobile wireless set in the first aspect, the phase locked loop includes a reference divider, a prescaler, a programmable divider, a phase detector, a charge pump, a loop filter, and a voltage-controlled oscillator, and when the intermittent signal is OFF, the power supply to the reference divider, the prescaler, the programmable divider, and the phase detector is stopped, and the output of the charge pump is made to be high impedance state so as to hold the output voltage to be the value at the loop locked state of the phase locked loop.

As stated above, in the fifth aspect of the present invention, when the intermittent signal is OFF, singe the power supply to the reference divider, the prescaler, the programmable divider, and the phase detector is stopped, and the output of the charge pump is made to be high impedance state so as to hold the output voltage to be the value at the loop looked state of the phase looked loop, a mobile wireless set can be realized in which the power consumption in the reference divider, the prescaler, the programmable divider, and the phase detector is greatly reduced, and the frequency stability of the output signal of the frequency synthesizer is increased.

According to the sixth aspect of the present invention, there is provided a mobile wireless set in which, in the mobile wireless set in the fifth aspect, the intermittent control unit includes a phase resetting unit for resetting the phases of the output signals of the reference divider and the programmable divider when the intermittent signal is turned ON.

As stated above, in the sixth aspect of the present invention, when the intermittent signal is turned ON, the intermittent control unit resets the phases of the output signals of the reference divider and the programmable divider, whereby the disturbance of the frequency in the output signal of the frequency synthesizer.

According to the seventh aspect of the present invention, there is provided a mobile wireless set wherein, in the mobile wireless set in the first aspect, the control signal includes, in each frame, a frame synchronization detecting signal and a plurality of words in a time-division multiplex, and the intermittent signal generating means comprises means for calculating a predetermined time From the detection of the frame synchronization detecting signal so as to detect the predetermined words to turn ON the intermittent signal.

As stated above, in the seventh aspect of the present invention, the intermittent signal generating means calculates a predetermined time from the detection of the frame synchronization detecting signal so as to detect the predetermined words to turn ON the intermittent signal, thereby the power consumption is reduced and the frequency stability of the output signal of the frequency synthesizer is increased.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

BRIEF DESCRIPTION OF THE DRAWINGS

FIG. 10A is a timing diagram showing a control signal in a mobile wireless set according to the embodiment 3 of the present invention when it is in a waiting state;

FIG. 10B is a timing diagram showing an intermittent signal in the embodiment 3 of the present invention;

FIG. 10C is a timing diagram showing receiving data in the embodiment 2 of the present invention.

DESCRIPTION OF THE PREFERRED EMBODIMENTS

Embodiment 1

Figure 1:
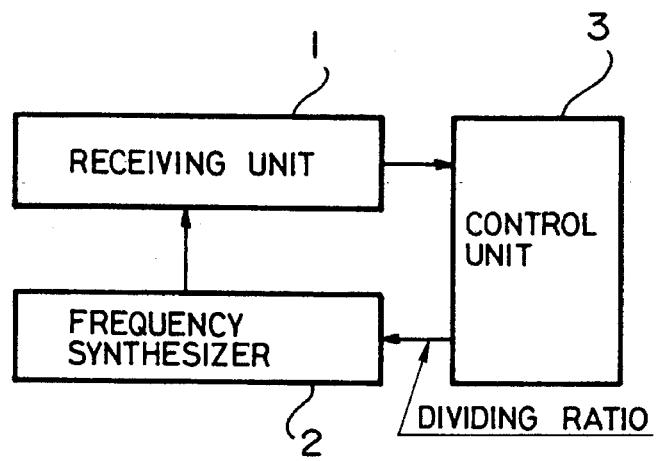
FIG. 1 is a block diagram showing an example of a conventional mobile wireless set.
Figure 3:
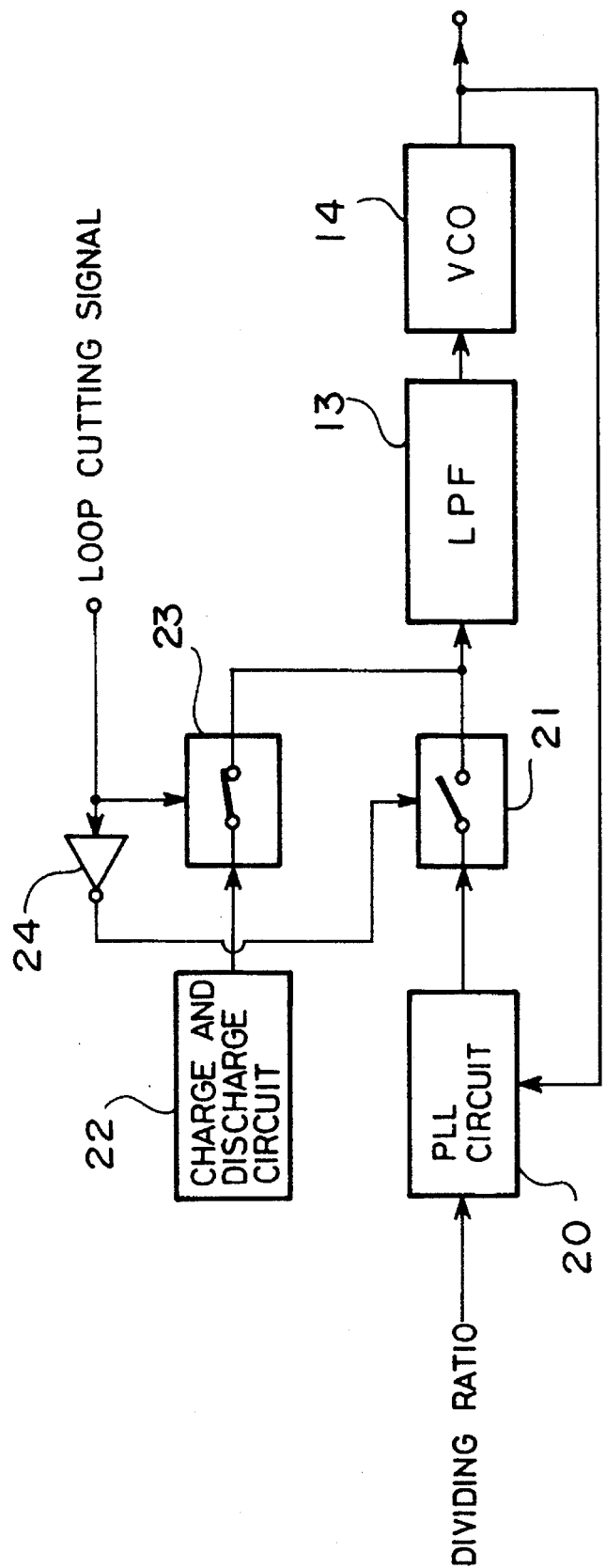
FIG. 3 is a block diagram showing another example of a conventional mobile wireless set.
Figure 6:
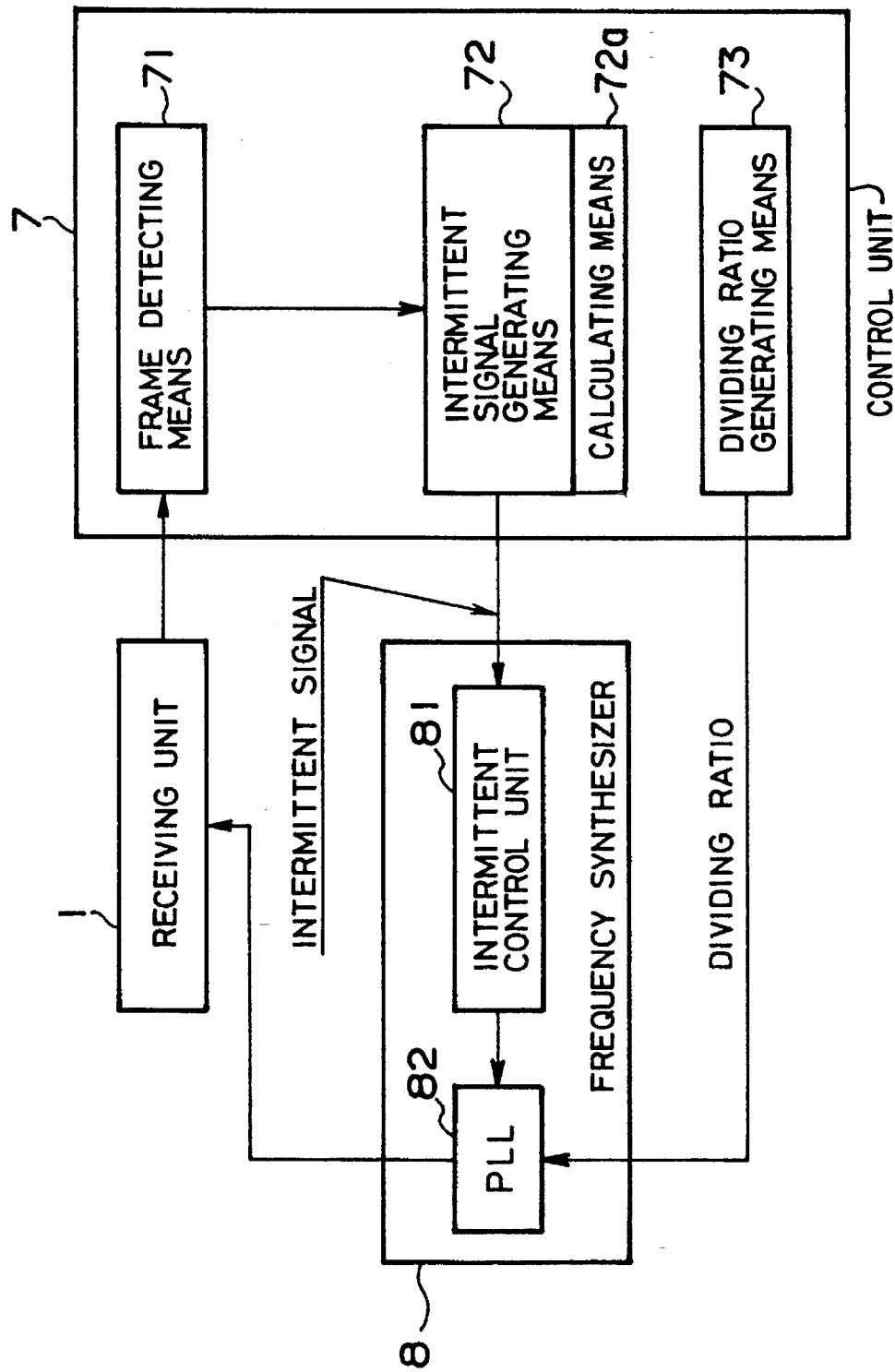
FIG. 6 is a block diagram showing a mobile wireless set according to an embodiment 1 of the present invention.
Figure 7:
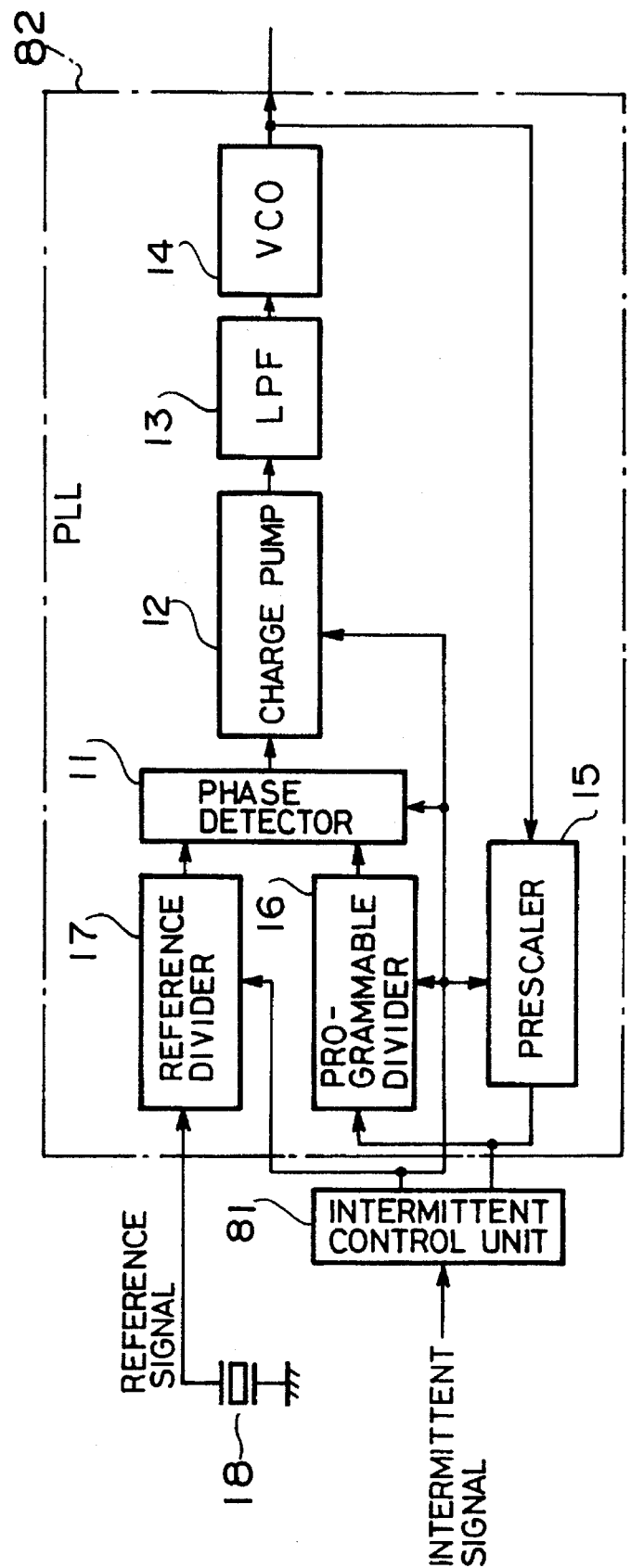
FIG. 7 is a block diagram showing the construction of a frequency synthesizer in the above-mentioned embodiment.

In the following, the embodiment 1 of the present invention will be described with reference to the drawings. FIG. 6 is a block diagram showing a mobile wireless set according to an embodiment of the present invention. The difference between FIG. 6 and FIG. 3 which shows the construction of the conventional mobile wireless set is that the constructions of a control unit 7 and a frequency synthesizer 8 are different from the constructions of the control unit 1 and the frequency synthesizer 2 in FIG. 1. The other parts are the same as those in FIG. 1 and are denoted by the same reference numerals. In FIG. 6, reference numeral 1 is the receiving unit which is the same as the receiving unit 1 in FIG. 1, and 7 represents the control unit for generating an intermittent signal according to the embodiment of the present invention. The control unit 7 includes frame detecting means 71, intermittent signal generating means 72, and dividing ratio generating means 73. Reference numeral 8 is the frequency synthesizer including an intermittent control unit 81 and a phase locked loop (PLL) 82 which are described later in more detail.

The intermittent signal according to the embodiment of the present invention is turned ON only during one period when the control unit 7 receives predetermined words corresponding to the period necessary and sufficient to stabilize the output of the frequency synthesizer 8, in a waiting state for waiting an arriving call to the mobile wireless set under consideration and in each frame of the control signal sent from the receiving unit 1 to the control unit 7.

Figure 4:
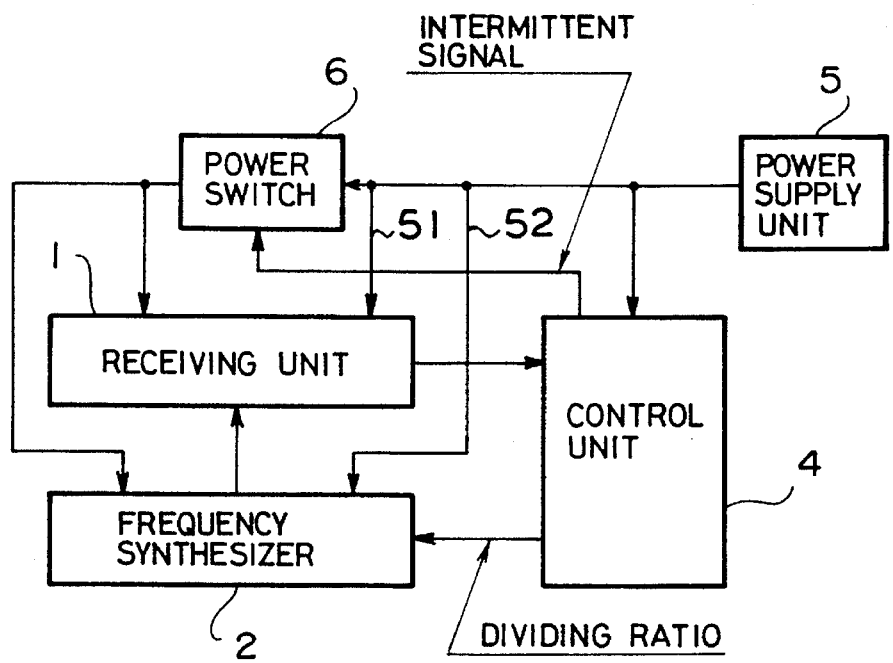
FIG. 4 is a block diagram showing still another example of a conventional mobile wireless set.
Figure 5A:
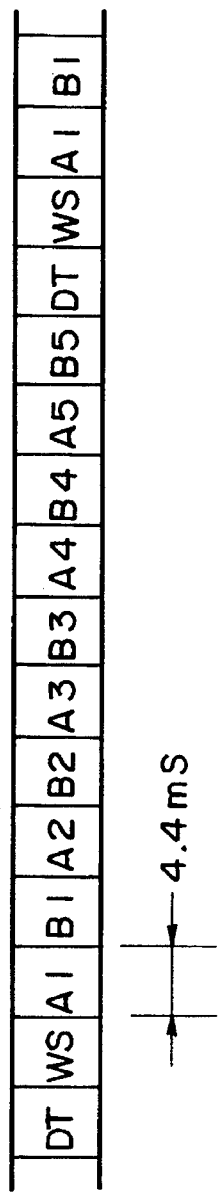
FIG. 5A is a timing diagram showing a control signal in the mobile wireless set shown in FIG. 4 when it is in a waiting state.
Figure 5B:
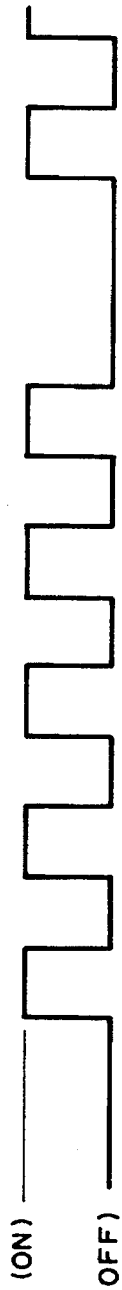
FIG. 5B is a timing diagram showing an intermittent signal in the mobile wireless set shown in FIG. 4 when it is in a waiting state.

By contrast, the conventional intermittent signal generated by the conventional control unit 4 shown in FIG. 4 is turned ON every time the words allocated to the mobile wireless set under consideration are inputted, as shown in FIG. 5B.

Figure 2:
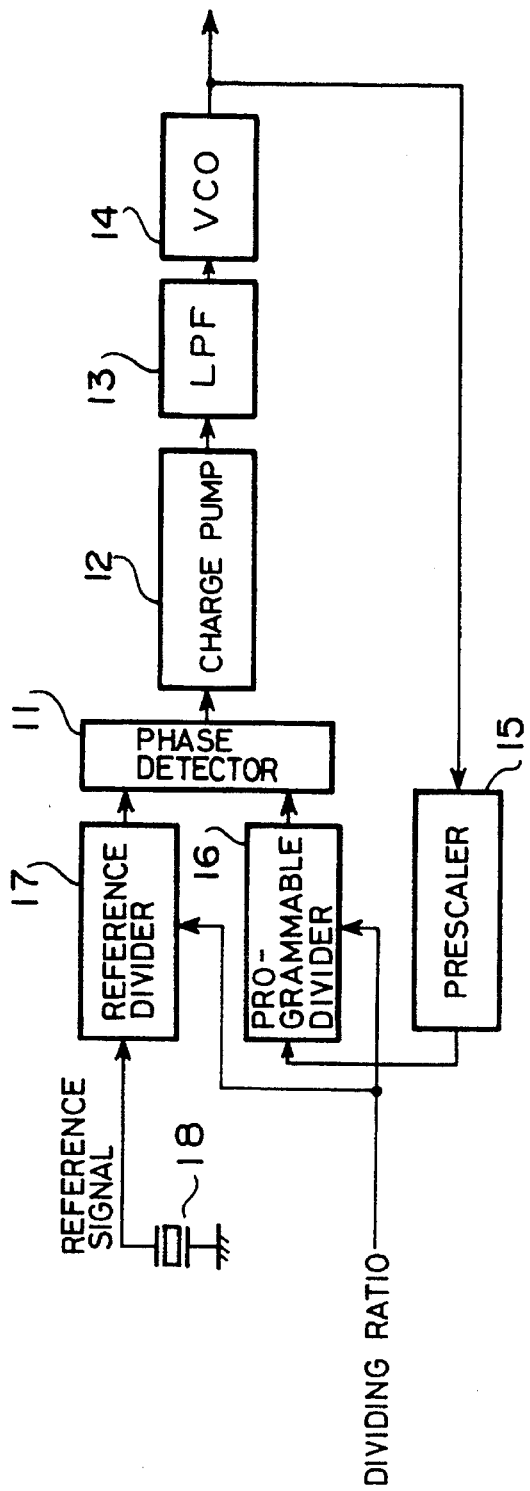
FIG. 2 is a block diagram showing the construction of the frequency synthesizer in the mobile wireless set shown in FIG. 1.

FIG. 7 is a block diagram showing the construction of the frequency synthesizer 8. The difference between the construction of the frequency synthesizer 8 shown in FIG. 7 and the construction of the frequency synthesizer 2 shown in FIG. 2 is that the frequency synthesizer 8 includes the intermittent control unit 81. The other parts are denoted by the same reference numerals as those in FIG. 2. In FIG. 7, reference numeral 11 is a phase detector, 12 is a charge pump, 13 is a loop filter, 14 is a voltage-controlled oscillator, 15 is a prescaler, 16 is a programmable divider, and 17 is a reference divider, which are the same or similar parts with the conventional parts denoted by the same reference numerals in FIG. 2, and therefore, the detailed explanation thereof are omitted here. When the intermittent signal sent from the control unit 7 is turned OFF, the intermittent control unit 81 stops to supply a power to the reference divider 17, the programmable divider 16, the prescaler 15, and the phase detector 11 so as to turn them in a low consuming power state, and makes the input of the charge pump 12 to be high impedance state so that the output voltage thereof is kept to the value when the PLL in the frequency synthesizer is locked.

Figure 8:
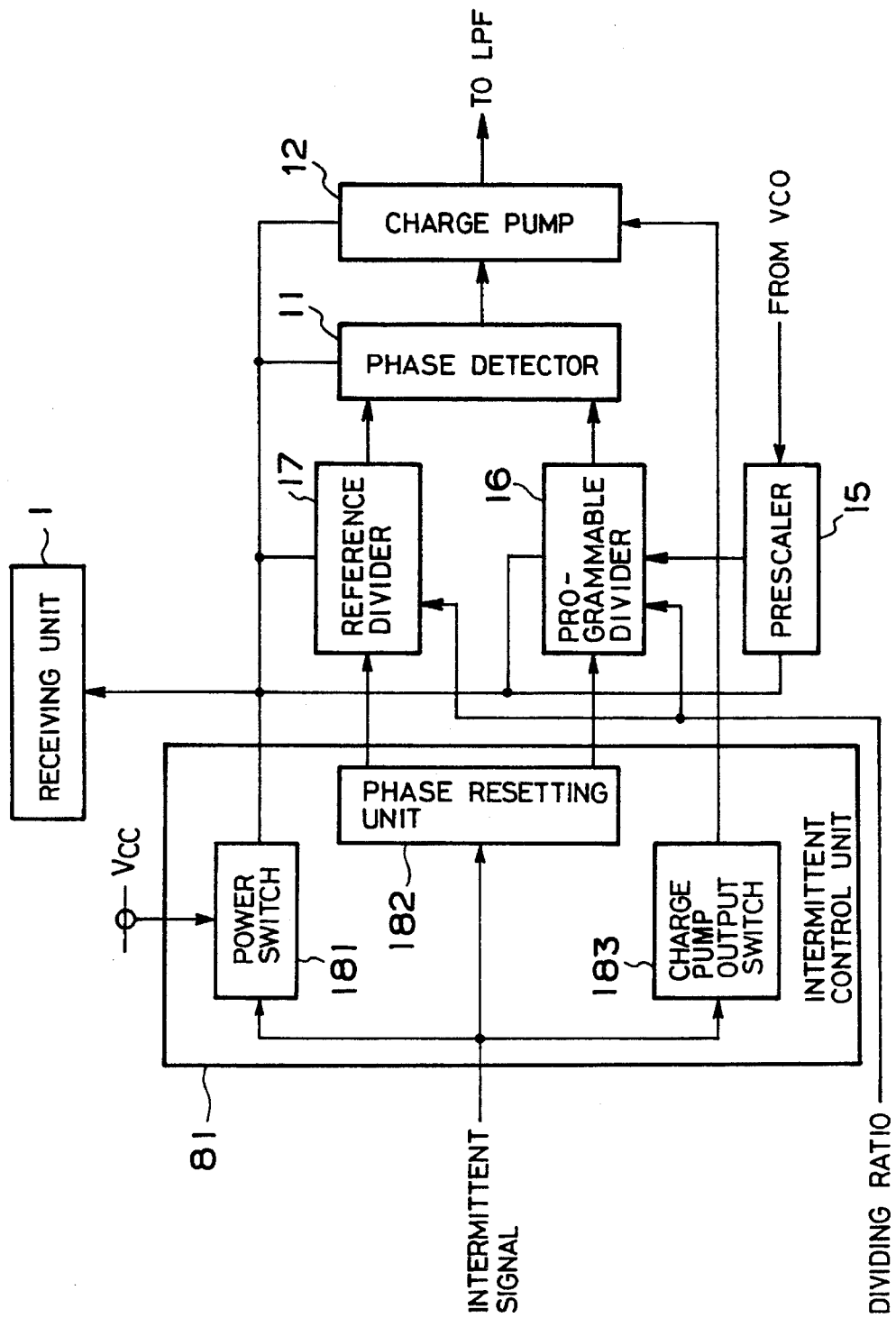
FIG. 8 is a block diagram showing the construction of an intermittent control unit in the above embodiment.

FIG. 8 is a block diagram showing the construction of the intermittent control unit 81 in the frequency synthesizer 8 shown in FIG. 7. In the figure, reference numeral 181 is a power switch for supplying a power to the programmable divider 16, the reference divider 17, the phase detector 11, the charge pump 12, and the prescaler 15 only during a period when the intermittent signal sent from the control unit 7 is ON, and for stopping the supply of the power in the other period. Reference numeral 182 is a phase resetting unit for resetting the outputs of the reference divider 17 and the programmable divider 16 when the intermittent signal is turned ON, and 183 is a charge pump output switch for making the output of the charge pump 12 to be a high impedance state.

Next, the operation of the mobile wireless set shown in FIG. 6 to FIG. 8 will be described. In the intermittent signal generating means 72 in the control unit 7, the predetermined words corresponding to the period necessary and sufficient to stabilize the output of the frequency synthesizer 8 are previously registered. The sufficient period is determined depending on the characteristic of the frequency synthesizer 8. Accordingly, the above-mentioned necessary and sufficient period corresponding to the predetermined words is not always determined by a time slot for one word but may be, for example, a period for a predetermined 1.5 words. As the above-mentioned predetermined words, it is preferable to designate signals unnecessary for the mobile wireless set under consideration.

When an input electric field detecting circuit (not shown) in the receiving unit 1 detects an input electric field higher than a predetermined level, the mobile wireless set enters into a waiting state for waiting an arriving call. In this state, the frame detecting means 71 detects a signal indicating the head of the frame. The intermittent signal generating means 72 detects the fact that the above-mentioned previously registered predetermined words have been received by calculating through calculating means 72a a predetermined time from the head of the frame by means of a timer and so forth. When the reception of the above-mentioned predetermined words is detected, the intermittent signal generating means 72 turns ON the intermittent signal for the period of the above-mentioned predetermined words.

During the period when the intermittent signal is ON, namely, the power switch 181 in the frequency synthesizer 8 is closed to supply a power to the reference divider 17, the programmable divider 16, the prescaler 15, the phase detector 11, and the charge pump 12 so that the frequency synthesizer 8 oscillates with the frequency determined by the dividing ratio specified by the control unit 7. The output signal of the voltage-controlled oscillator 14 is sent to the receiving unit 1 and, as a local oscillating signal, to the receiving unit 1 and to the prescaler 15.

On the other hand, during a period when the intermittent signal is OFF, the power switch 181 in the frequency synthesizer 8 is opened so that the operations of the reference divider 17, the programmable divider 16, the prescaler 15, the phase detector 11, and the charge pump 12, which constitute the phase locked loop (PLL) 82 in the frequency synthesizer 8, are stopped to be the low power consumption state, and the output of the charge pump 12 is made to be a high impedance state to hold the output voltage of the charge pump 12 to be the value at the PLL lock of the frequency synthesizer 8. The loop filter 13 holds the output voltage of the charge pump 12 in accordance with its time constant. Accordingly, the control voltage applied from the loop filter 13 to the voltage-controlled oscillator 14 is kept to be almost constant, and the frequency of the output signal is almost kept to the state when the PLL in the frequency synthesizer 8 is locked.

When the intermittent signal is turned ON again from the OFF state, the phase resetting unit in the intermittent control unit 81 resets the programmable divider 16 and the reference divider 17 so as to forcibly make the phases of the output signals of the programmable divider 16 and the reference divider 17 to be coincident with each other. This is to prevent a large error signal from being output from the phase detector 11 due to an uncertainty of the phase difference of the output signals of the programmable divider 16 and the reference divider 17 when the intermittent signal is turned ON again. By this control, the frequency disturbance of the output signal of the voltage-controlled oscillator 14 can be suppressed to be small.

During a period when the intermittent signal is ON, the frequency synthesizer 8 operates in the similar way as in the conventional frequency synthesizer 2 to supply the frequency specified by the control unit 7 to the receiving unit 1.

Since the intermittent signal is turned ON only one time in each frame, the time interval between adjacent ON periods of the intermittent signal is relatively long in comparison to the conventional case shown in FIG. 5B, so that the frequency of the output signal of the frequency synthesizer 8 is stabilized.

In conclusion, in this embodiment 1, when the control unit 7 is under a waiting state for waiting an arriving call to the mobile wireless set under consideration, the intermittent signal is turned ON only during a period when the predetermined words in the control signal inputted from the receiving unit 1 to the control unit 7 are inputted. The predetermined words correspond to a period necessary and sufficient to stabilize the output of the frequency synthesizer 8. Preferably, the above-mentioned predetermined words are words unnecessary for the mobile wireless set under consideration. Thereby, only during the short period when the intermittent signal is ON (during the period when the unnecessary predetermined words are inputted), the PLL is operated to draw the frequency of the output signal of the frequency synthesizer 8, and during the long period when the intermittent signal is OFF, the power supply to the PLL is stopped and the frequency of the output signal of the frequency synthesizer 8 is held to the value drawn during the ON period of the intermittent signal. Thus, during the long period when the intermittent signal is OFF, the power supply to the programmable divider 16, the reference divider 17, the prescaler 15, and the phase detector 11 can be stopped, so that the power consumption of the mobile wireless set can be reduced without using the complex and expensive charge and discharge circuit.

Embodiment 2

Figure 9A:
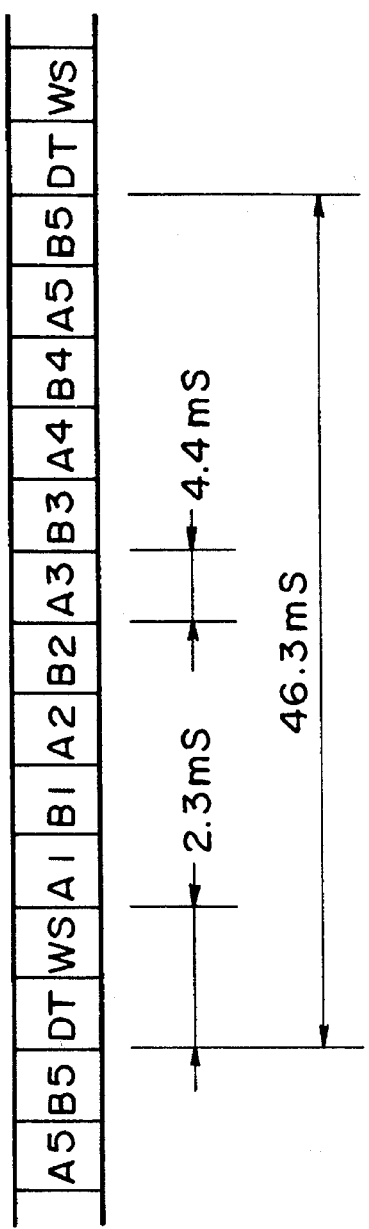
FIG. 9A is a timing diagram showing a control signal in a mobile wireless set according to the embodiment 2 of the present invention when it is in a waiting state.
Figure 9B:
FIG. 9B is a timing diagram showing an intermittent signal in the embodiment 2 of the present invention.
Figure 9C:
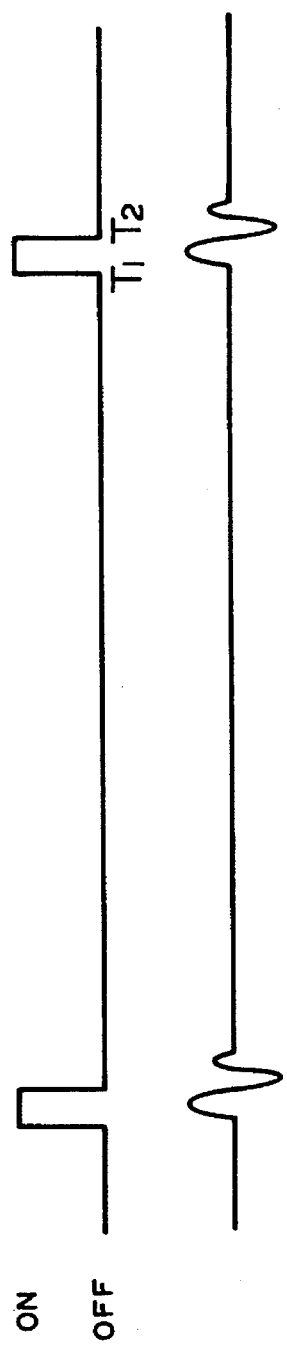
FIG. 9C is a timing diagram showing receiving data in the embodiment 2 of the present invention.

Next, the relation among the control signal, the intermittent signal, and the receiving data according to an embodiment 2 of the present invention will be described with reference to FIG. 9A to FIG. 9C. FIG. 9A to FIG. 9C are timing diagrams showing the time relation among the control signal, the intermittent signal, and the receiving data, during a waiting state, in an embodiment when the mobile wireless set of the embodiment 1 is applied to the aforementioned 800 MHz mobile wireless telephone system "EIA IS-19" in U.S.A.

As shown in FIG. 9A, each frame of the control signal consists of the dotting DT and the word synchronization WS which indicate the head of the frame, and a series of signals A1, B1, A2, B2, ..., A5, and B5, of the A words and B words which are arranged alternately. The sum of the periods for the DT and the WS is 2.3 ms, and the period for each word in the A words and B words is 4.4 ms. Accordingly, one frame period is 46.3 ms.

According to the "EIA IS-19" system, as mentioned before, either one of the A words and B words are received depending on the even or odd telephone number, and an arriving of a call is detected by a 3/5 decision of majority for the receiving data. For example, when the first bits of the received words A1, A2, A3, A4, and A5 are "1", "1", "0", "1", "0", respectively, the first bit of the A words is determined as "1".

FIG. 9A to FIG. 9C show the case as an example when the mobile wireless set under consideration receives the A words. FIG. 9A shows the control signal during a waiting state for waiting an arriving call to the mobile wireless set under consideration, FIG. 9B shows the intermittent signal according to the embodiment 2, and FIG. 9C shows receiving data outputted from the receiving unit 1.

As shown in the figures, in case the mobile wireless set for receiving the A words, the B words in the control signal shown in FIG. 9A are unnecessary signals. Therefore, in this embodiment 2, during a period when, for example, the word B5 is received among the unnecessary words B1 to B5, the intermittent signal generating means 72 in the control unit 7 turns ON the intermittent signal supplied to the frequency synthesizer 8. In the example shown in FIG. 9B, during the period when the word B5 is received, the intermittent signal is turned ON, however, the intermittent signal may be turned ON during a period when any one of the words B1 to B4 is received.

Only during the short period corresponding to the word B5 in which the intermittent signal is turned ON, the PLL in the frequency synthesizer 8 is supplied with the power to draw the frequency. The period in which the intermittent signal is ON is, in this embodiment 2, the one word period, i.e., 4.4 ms. When the intermittent signal changes from OFF to ON, the output frequency of the frequency synthesizer 8 is slightly disturbed due to the drawing of the frequency so that the receiving data is disturbed as shown in FIG. 9C. The period of the disturbance of the frequency in the output signal of the frequency synthesizer 8 is determined by the characteristic of the frequency synthesizer 8. In the embodiment 2, the synthesizer 8 has such a characteristic that the disturbance is within the period of the word B5 being received. Therefore, even when the intermittent signal is turned ON during the period only when the word B5 is received, and even when the intermittent signal is turned OFF during the other period, the receiving rate is not deteriorated.

During the OFF period of the intermittent signal, as described in the embodiment 1, since the output frequency of the frequency synthesizer 8 is almost kept to the locked state, the receiving data is not disturbed.

Embodiment 3

In the above embodiment 2, when the A words are allocated to the mobile wireless set under consideration, description was given for the case in which all of the words A1 to A5 in the control signal are the signals necessary for the mobile wireless set under consideration, however, it may also be possible to handle several parts of the words A1 to A5 as unnecessary signal part. FIG. 10A to 10C are timing diagrams showing the time relation among the control signal, the intermittent signal, and the receiving data during a waiting state, in an embodiment 3 of the present invention. In the illustrated example, the data of the words A4 and A5 are neglected and are deemed as unnecessary signal parts so that an arriving call is detected by 2/3 decision by majority for the words A1 to A3. For example, when the first bits of the words A1, A2, and A3 are "1", "0", and "1", respectively, the first bit of the A words is determined as "1" by the 2/3 decision by majority. Similarly, for the bits of on and after the second bit also, the 2/3 decision by majority is effected to determine the values. The intermittent signal, in the illustrated example, is turned ON when the word A4 is received, and is turned OFF at a middle of the word B4 subsequent to the word A4. The ON period of the intermittent signal is determined by the characteristic of the frequency synthesizer 8. The timings of the ON and OFF of the intermittent signal are determined by calculating, by means of timer and so forth, predetermined times from the detection of the signals DT and WS indicating the head of a frame in the control signal. The operation of the frequency synthesizer 8 during the ON period and the OFF period of the intermittent signal is the same as that described in the embodiment 1 and the embodiment 2, and therefore the explanation is omitted here.

Since the words A4 and A5 are deemed as unnecessary signal parts for the mobile wireless set under consideration, it is sufficient to complete the drawing of the frequency of the output signal of the frequency synthesizer 8 until the end of the frame.

The intermittent signal in this embodiment 3 can be also applied to the case in which a mobile wireless set receives the B words as the necessary signal parts for detecting an arriving call. Therefore, the ON/OFF timings of the intermittent signal are the same for both cases of the mobile wireless set in which the A words are received and the mobile wireless set in which the B words are received, so that the control by software in the intermittent signal generating means 72 in the control unit 7 is simplified.

Figure 11:
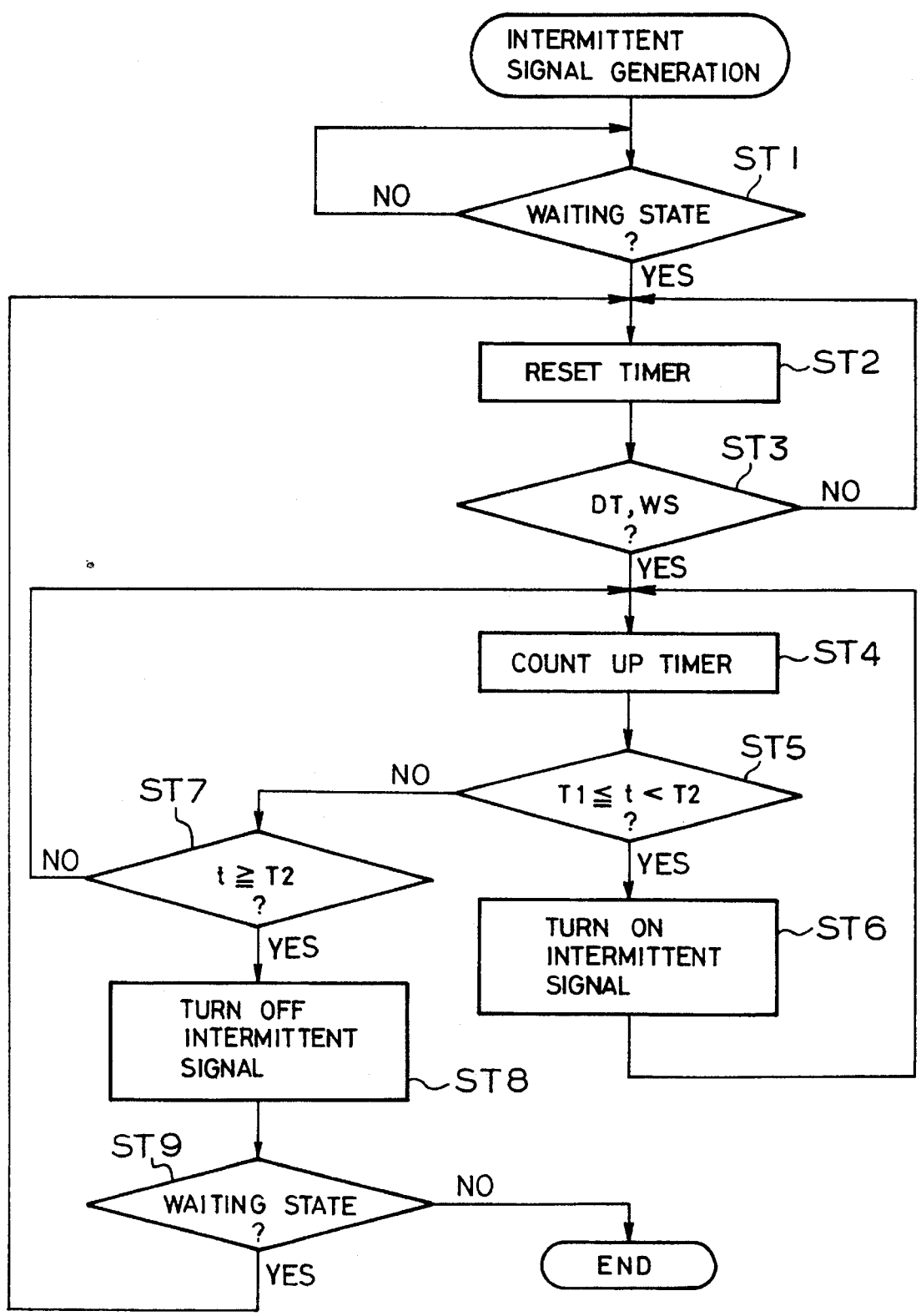
FIG. 11 is a flow chart explaining the generation of the intermittent signal in the embodiments 2 and 3.

FIG. 11 is a flow chart explaining the generating of the intermittent signal in the embodiment 2 or the embodiment 3. As shown in the figure, when the mobile wireless set under consideration is in a waiting state (step ST1), a timer is reset (ST2). Then, when the head (DT and WS) of a frame of the control signal is detected (ST3), the timer starts to count up (ST4). When the count value t of the timer enters into a range expressed by T1≦t<T2 (ST5), the intermittent signal is turned ON (ST6), where T1 is the time corresponding to the beginning of the word B5 in the embodiment 2, or the time corresponding to the beginning of the word A4 in the embodiment 3, and T2 is the time to fall the intermittent signal. When the count value t of the timer becomes the predetermined time T2 (ST7), the intermittent signal is turned OFF (ST8).

As described above, according to the first aspect of the present invention, since the intermittent signal generated by the intermittent signal generating means is turned ON only during the period when the predetermined words, corresponding to the period necessary and sufficient to stabilize the output of the frequency synthesizer, are inputted, and is turned OFF in the other period, the OFF period, in which the intermittent signal is OFF so that the power is not supplied to at least a part of the phase locked loop and the receiving unit, becomes long, thereby the power consumption can be reduced. In addition, since the intermittent signal is turned ON only one period necessary and sufficient within one frame, there is a long time interval between two ON periods, so that the frequency of the output signal of the frequency synthesizer is stabilized. Further, by holding the output voltage of the phase locked loop to be the value at the ON time immediately before the OFF time, the stability of the frequency synthesizer in the intermittent operation can be increased.

According to the second aspect of the present invention, since the intermittent signal is turned ON only when the predetermined one word in the control signal is inputted, the power consumption can be greatly reduced.

According to the third aspect of the present invention, since the intermittent signal is turned ON only during a period when the control unit receives the predetermined one of the words allocated to the another mobile wireless set, the phase locked loop is operated only when the predetermined one word which is not necessary for the mobile wireless set under consideration is inputted, and the intermittent signal is turned OFF in the other period, thereby the power consumption can be greatly reduced. In addition, the mobile wireless set can be applied to a mobile wireless telephone system in which the words for detecting arriving calls are different depending whether the telephone number is even or odd.

The intermittent signal generating means in the fourth aspect of the present invention turns ON of the intermittent signal only during a period when the control unit receives a predetermined one of the first words allocated to the mobile wireless set under consideration and one of the second words subsequent to the predetermined one of the first words, thereby a mobile wireless set having a time margin in a frequency drawing time for the frequency synthesizer can be realized.

According to the fifth aspect of the present invention, when the intermittent signal is OFF, since the power supply to the reference divider, the prescaler, the programmable divider, and the phase detector is stopped, and the output of the charge pump is made to be high impedance state so as to hold the output voltage to be the value at the loop locked state of the phase locked loop, a mobile wireless set can be realized in which the power consumption in the reference divider, the prescaler, the programmable divider, and the phase detector is greatly reduced, and the frequency stability of the output signal of the frequency synthesizer is increased.

According to the sixth aspect of the present invention, the intermittent signal generating means calculates a predetermined time from the detection of the frame synchronization detecting signal so as to detect the predetermined words, and in response to this detection, the intermittent signal is turned ON, thereby a mobile wireless set can be realized in which the power consumption is reduced and the frequency stability of the output signal of the frequency synthesizer is increased.

What is claimed is:

1. A mobile wireless set for receiving an arriving call, comprising:

a receiving unit for demodulating a receiving signal to output a sound signal and a control signal, said control signal consisting of a plurality of words in each frame;

a frequency synthesizer, including a phase locked loop, for supplying in response to the level of a control voltage of said phase locked loop, an output signal having a frequency generated by said phase locked loop to said receiving unit;

a control unit for receiving said control signal and for informing said frequency synthesizer of the frequency to be generated and for storing a number of predetermined words specifying a time period for stabilizing the output frequency of said frequency synthesizer;

intermittent signal generating means, included in said control unit, for generating, during a waiting state for waiting said arriving call, an intermittent signal corresponding to said control signal, said intermittent signal being turned ON only during one period in each frame of said control signal corresponding to said time period specified by said number of predetermined words stored in said control unit; and an intermittent control unit, included in said frequency synthesizer, for turning ON or OFF, in response to the ON or OFF of said intermittent signal, a power supply for at least part of said phase locked loop, and for holding, when said intermittent signal is OFF, the level of the control voltage of said phase locked loop at the same level as that existing at the time immediately before said power supply is turned OFF in response to said intermittent signal.

2. A mobile wireless set as claimed in claim 1, wherein said intermittent signal generating means comprises means for turning said intermittent signal ON during a period when said control unit receives a predetermined one word in said control signal corresponding to said time period, and for turning said intermittent signal OFF during a period when said control unit receives a signal part of said control signal other than said predetermined one word.

3. A mobile wireless set as claimed in claim 2, wherein said control signal includes first words allocated to said mobile wireless set and second words allocated to another mobile set, said first words and said second words being alternately multiplexed in time division, and said intermittent signal generating means comprises means for turning ON of said intermittent signal only during a period when said control unit receives a predetermined one of said second words allocated to said another mobile wireless set.

4. A mobile wireless set as claimed in claim 1, wherein said control signal includes first words allocated to said mobile wireless set and second words allocated to another mobile set, said first words and said second words being alternatingly multiplexed in time division, and said intermittent signal generating means comprises means for turning ON of said intermittent signal only during a period when said control unit receives a predetermined one of said first words allocated to said mobile wireless set and one of said second words subsequent to said predetermined one of said first words.

5. A mobile wireless set as claimed in claim 1, wherein said phase locked loop includes a reference divider for dividing a reference signal by a predetermined dividing ratio to output a signal having a reference frequency, a prescaler for shaping the output signal of said phase locked loop, a programmable divider for dividing the output of said prescaler by said predetermined dividing ratio and producing an output signal, a phase detector for comparing the phase of the output signal of said reference divider and the phase of the output signal of said programmable divider to output a phase difference therebetween, a charge pump for generating an output voltage proportional to the phase difference, a loop filter for removing high frequency components from the output voltage of said charge pump, and a voltage-controlled oscillator for generating a signal having a frequency controlled by the output voltage of said charge pump, and when said intermittent signal is OFF, the power supply to said reference divider, said prescaler, said programmable divider, and said phase detector is stopped, and the output of said charge pump is made to be high impedance state so as to hold the output voltage to be the value at the loop locked state of said phase locked loop.

6. A mobile wireless set as claimed in claim 5, wherein said intermittent control unit includes a phase resetting unit for resetting the phases of the output signals of said reference divider and said programmable divider when said intermittent signal is turned ON.

7. A mobile wireless set as claimed in claim 1, wherein said control signal includes, in each frame, a frame synchronization detecting signal and a plurality of words in a time-division multiplex, and said intermittent signal generating means comprises means for calculating a predetermined time from the detection of said frame synchronization detecting signal so as to detect said predetermined words to turn ON of said intermittent signal.

* * * * *

UNITED STATES PATENT AND TRADEMARK OFFICE
CERTIFICATE OF CORRECTION

PATENT NO. : 5,475,877
DATED : December 12, 1995
INVENTOR(S) : Keigo Adachi

It is certified that error appears in the above-indentified patent and that said Letters Patent is hereby corrected as shown below:

Col. 2, line 48, "2S" should be -- 23 --;
Col. 7, line 44, "From" should be -- from --;
<u>In the Claims:</u> Col. 14, line 29 (claim 1), delete the comma.

Signed and Sealed this

Third Day of September, 1996

Attest:

BRUCE LEHMAN

Attesting Officer     *Commissioner of Patents and Trademarks*